(12) United States Patent
Toyoda et al.

(10) Patent No.: US 6,271,691 B1
(45) Date of Patent: Aug. 7, 2001

(54) CHOPPER TYPE VOLTAGE COMPARISON CIRCUIT

(75) Inventors: Kenji Toyoda; Kimio Maruyama, both of Yokohama; Eisuke Inoue, Kawasaki, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/605,887

(22) Filed: Jun. 29, 2000

(30) Foreign Application Priority Data

Jun. 30, 1999 (JP) ................................................. 11-185113

(51) Int. Cl.[7] ...................................................... H03K 5/22
(52) U.S. Cl. ................................................. 327/77; 327/63
(58) Field of Search ................................... 327/63, 78, 80, 327/91, 77, 74, 93

(56) References Cited

U.S. PATENT DOCUMENTS

| 5,329,172 | 7/1994 | Kohdaka . | |
| 5,936,434 | * 8/1999 | Kumamoto et al. | 327/77 |
| 5,952,951 | 9/1999 | Fujino . | |
| 5,959,469 | * 9/1999 | Kurauchi et al. | 327/77 |
| 6,144,232 | * 11/2000 | Yukawa et al. | 327/77 |

FOREIGN PATENT DOCUMENTS 7-264018   10/1995   (JP) .

* cited by examiner

Primary Examiner—Kenneth B. Wells
Assistant Examiner—Hiep Nguyen
(74) Attorney, Agent, or Firm—Oblon, Spivak, McClelland, Maier & Neustadt, P.C.

(57) ABSTRACT

A chopper type voltage comparison circuit is disclosed which restrain leakage current between an input and output nodes of each amplifying circuit to enable normal voltage comparisons even if a threshold voltage for each transistor is reduced to diminish a power supply voltage. This chopper type voltage comparison circuit comprises a capacitor C1 having an input voltage or a reference voltage selectively supplied to one end thereof depending on whether a voltage input operation or a voltage comparison operation is to be performed, a CMOS clocked inverter circuit CINV1 for voltage amplification having a voltage at the other end of the capacitor input to an input node thereof and having a clock gate section biased so as to be constantly conductive, and a CMOS clocked inverter circuit CINV4 for input voltage setting having the same circuit configuration as the CMOS clocked inverter circuit for voltage amplification, having an input and output nodes short-circuited thereto, and connected to the input node of the CMOS clocked inverter circuit for voltage amplification so that the clock gate section is switch-controlled to be turned on for the voltage input operation, while the clock gate section is switch-controlled to be turned off for the voltage comparison operation.

14 Claims, 3 Drawing Sheets

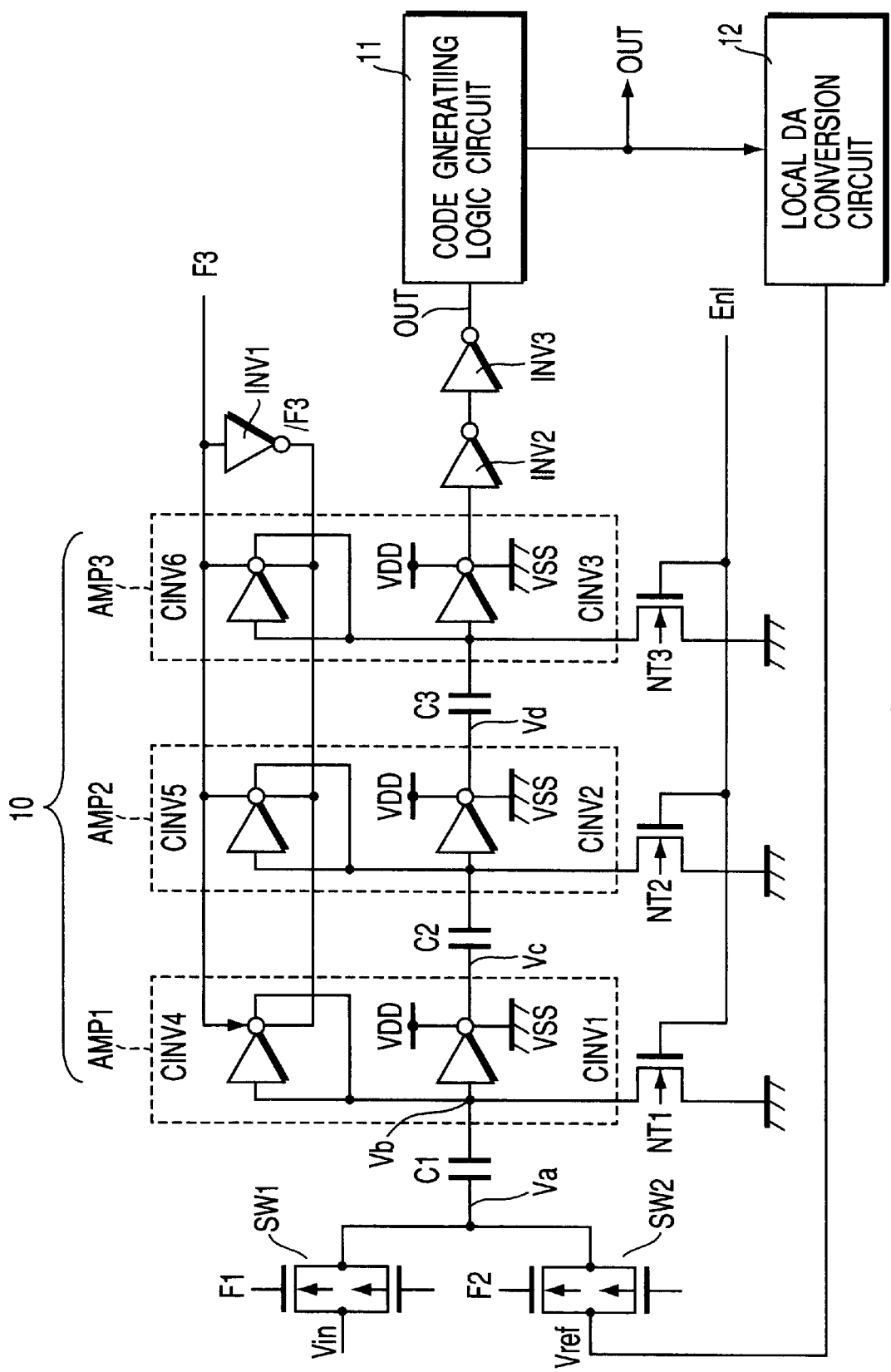
F I G. 1

CHOPPER TYPE VOLTAGE COMPARISON CIRCUIT

CROSS-REFERENCE TO RELATED APPLICATIONS

This application is based upon and claims the benefit of priority from the prior Japanese Patent Application No. 11-185113, filed Jun. 30, 1999, the entire contents of which are incorporated herein by reference.

BACKGROUND OF THE INVENTION

The present invention relates to a voltage comparison circuit formed into a semiconductor integrated circuit, and in particular, to a chopper type voltage comparison circuit using CMOS clocked inverter circuits to amplify a difference between an input voltage and a reference voltage, the circuit being used, for example, in a sequential-comparison analog digital converting circuit (an AD converter).

A CMOS type sequential-comparison AD converter comprises a plurality of chopper type voltage comparison circuits connected together to amplify a difference between a conversion voltage input (an input signal voltage) and a local analog voltage (a reference voltage). An output voltage from the plurality of connected chopper type voltage comparison circuits is input to a code generating logic circuit to generate a digital code, which is then input to a local AD converting circuit to generate a local analog voltage.

FIG. 5 shows an example of a conventional chopper type voltage comparison circuit used in a sequential-comparison AD converter.

In FIG. 5, analog switches SW1 and SW2 select a conversion voltage input (a signal input voltage Vin) and a local analog voltage (a reference voltage for comparison Vref) in a switching fashion. The analog switch SW1 is controlled by complementary clock signals (F1, /F1). The analog switch SW2 is controlled by complementary clock signals (F2, /F2).

In the AD converter in FIG. 5, for example, three chopper type voltage comparison circuits are connected together. Each of the chopper type voltage comparison circuits comprises a capacitor having the input voltage or the reference voltage supplied to one end thereof depending on whether a voltage input operation (a sample period) or a voltage comparison operation (a comparison period) is to be performed, and an amplifying circuit having a CMOS inverter circuit for voltage amplification connected to the other end of the capacitor and an analog switch for bias initialization connected between an input node and an output node of the inverter circuit. Correspondingly to the first, second, and third comparison circuit, the capacitors are denoted by C1 to C3, the CMOS inverter circuits are denoted by INV1 to INV3, the analog switches are denoted by SW3 to SW5, and the amplifying circuits are denoted by AMP1 to AMP3. The first comparison circuit comprises the capacitor C1, and the amplifying circuit AMP1 having the CMOS inverter circuit INV1 and an analog switch SW3. The second comparison circuit comprises the capacitor C2, and the amplifying circuit AMP2 having the CMOS inverter circuit INV2 and an analog switch SW4. The third comparison circuit comprises the capacitor C3, and the amplifying circuit AMP3 having the CMOS inverter circuit INV3 and an analog switch SW5.

The analog switches SW3 to SW5 are each controlled by a clock signal F3 and an inverted clock signal /F3 obtained by the inverter circuit INV4 by inverting the clock signal F3.

In addition, NMOS transistors NT1 to NT3 are each connected between a ground node and an input node of a corresponding one of the inverter circuits INV1 to INV3, with an enable control signal En1 commonly applied to the gates of the NMOS transistors NT1 to NT3 in a predetermined timing. Thus, the NMOS transistors NT1 to NT3 are switched on in the predetermined timing to set the input node of each inverter circuit INV1 to INV3 to a ground potential.

The three connected chopper type voltage comparison circuits have two inverter circuits INV5, INV6 connected on their output side.

Next, the operation of the chopper type voltage comparison circuit of an AD converter shown in FIG. 5 will be described.

First, during a sample period, the analog switch SW2 is controlled to be non-conductive, while the analog switches SW1, SW3, SW4, and SW5 are controlled to be conductive. Thus, input and output signals of the inverter circuits INV1, INV2, and INV3 are set to be short-circuited, and the input and output nodes of each of the inverter circuits INV1, INV2, and INV3 are set to have the same voltage. That is, bias voltages at the input and output nodes of each inverter circuit INV1, INV2, and INV3 are initialized. In the meantime, the input voltage Vin=Va is charged to the capacitor C1 through the analog switch SW1.

At this time, a potential Vb at the input node of the inverter circuit INV1 and a potential Vc at the output node thereof are each biased to a circuit threshold (substantially half a power supply voltage VDD) of the inverter INV1, and a charge corresponding to Vin-Vb is stored in the capacitor C1. Likewise, a charge is stored in the capacitors C2 and C3.

Next, during a comparison period, the analog switches SW1, SW3, SW4, and SW5 are controlled to be non-conductive, while the analog switch SW2 is controlled to be conductive. Thus, the reference Vref is applied to the capacitor C1 through the analog switch SW2, and the potential Vb at the input node of the inverter INV1 changes depending on the difference between the input voltage Vin and the reference voltage Vref, with this change amplified by the three inverter circuits INV1 to INV3. An output voltage from the final stage inverter circuit INV3 is input further through the two inverter circuits INV5, INV6 to a code generating logic circuit (not shown), which then determines which of the input voltage Vin and reference voltage Vref is higher to generate a digital code depending on a result of the determination.

The above described operations during the sample period and during the comparison period are sequentially performed until the individual bits of the digital code have been determined ranging from a most significant bit (MSB) to a least significant bit (LSB).

It is assumed that in response to a request for a low voltage operation of the AD converter, the power supply voltage VDD is lowered, with the threshold voltage of each transistor retaining at the same value as in the prior art.

In this case, when the power supply voltage VDD is reduced down to a value (for example, 1.8V) equal to or lower than the sum of the absolute value |Vtp| (for example, 0.9V) of the threshold voltage of a PMOS transistor of each inverter circuit INV1 to INV3 and a threshold voltage Vtn (for example, 0.9V) of the NMOS transistor, a voltage between a gate and a source of each of the MOS transistors becomes extremely low to disable normal operations of the inverter circuits INV1, INV2, and INV3. Additionally, in this case, when an "H" level and "L" level of a control signal for the analog switches SW3, SW4, and SW5 is 1.8V and 0V, respectively, a voltage between a gate and a source of each of the MOS transistors of each analog switch SW3, SW4, and SW5 becomes extremely low to disable normal operations of the analog switches SW3, SW4, and SW5.

Accordingly, the potentials at the input and output nodes of each inverter circuit INV1, INV2, and INV3 cannot be biased to the corresponding circuit thresholds. Thus, to enable the AD converter to operate at a low power supply voltage, the threshold voltage of each transistor must be reduced.

When the threshold voltage of each transistor is reduced, a leakage current from the transistors constituting the analog switches SW3, SW4, and SW5 and the inverter circuits INV1, INV2, and INV3 increases in the non-conductive state. A leakage current flowing through the output node and input node of each inverter circuit INV1, INV2, INV3 hinders the original potential Vb of the input node from being maintained.

If such a phenomenon occurs during the voltage comparison operation, the voltage comparison operation in the sequential-comparison AD converter is adversely affected to diminish AD conversion accuracy.

As described above, a problem of the conventional chopper type voltage comparison circuit is that when the threshold voltage of each transistor is reduced to diminish the power supply voltage VDD, a leakage current from the transistor increases in the non-conductive state, so that a leakage current flowing through the output and input node of the amplifying inverter circuit hinders the original potential of the input node from being maintained, thereby adversely affecting the voltage comparison operation.

BRIEF SUMMARY OF THE INVENTION

The present invention is provided to solve the above problems, and it is an object thereof to provide a chopper type voltage comparison circuit that can restrain leakage current between an input node and output node of each amplifying circuit to enable normal voltage comparison operations even if a threshold voltage of each transistor is reduced to diminish the power supply voltage VDD, thereby preventing a decrease in AD conversion accuracy if the circuit is used for an AD converter.

According to an aspect of the present invention, there is provided a chopper type voltage comparison circuit comprising a capacitor having an input voltage or a reference voltage supplied to one end thereof in a switching fashion depending on whether a voltage input operation or a voltage comparison operation is to be performed, a CMOS clocked inverter circuit for voltage amplification having a voltage at the other end of the capacitor input to an input node thereof and having a clock gate section biased so as to be constantly conductive, and a CMOS clocked inverter circuit for input voltage setting having the same circuit configuration as the CMOS clocked inverter circuit for voltage amplification, having an input and output nodes short-circuited thereto, and connected to the input node of the CMOS clocked inverter circuit for voltage amplification so that the clock gate section is switch-controlled to be turned on for the voltage input operation, while the clock gate section is switch-controlled to be turned off for the voltage comparison operation.

In the chopper type voltage comparison circuit according to the aspect of the present invention, the chopper type voltage comparison circuit may further comprise an analog switch interposed between the input node of the CMOS clocked inverter circuit for voltage amplification and the input node of the CMOS clocked inverter for input voltage setting and controlled to be conductive for the voltage input operation and to be non-conductive for the voltage comparison operation before the clock gate of the CMOS clocked inverter for input voltage setting is switch-controlled to be turned off. In the chopper type voltage comparison circuit, the CMOS clocked inverter circuit for input potential setting may include a first PMOS transistor, a second PMOS transistor, a first NMOS transistor, and a second NMOS transistor connected in series between a power supply node and a ground node, the second PMOS transistor and the first NMOS transistor having their gates connected together, the first PMOS transistor has a higher threshold voltage than the second PMOS transistor, while the second NMOS transistor has a higher threshold voltage than the first NMOS transistor, the first PMOS transistor and the second NMOS transistor are switch-controlled by clock signals, the clocked inverter circuit for voltage amplification may include a third PMOS transistor, a fourth PMOS transistor, a third NMOS transistor, and a fourth NMOS transistor connected in series between a power supply node and a ground node, the fourth PMOS transistor and the third NMOS transistor having their gates connected together, the third PMOS transistor has a higher threshold voltage than the fourth PMOS transistor, while the fourth NMOS transistor has a higher threshold voltage than the third NMOS transistor, and the third PMOS transistor has its gate connected to the ground node, while the fourth NMOS transistor has its gate connected to the power supply node. In the chopper type voltage comparison circuit, the analog switch may comprise a fifth PMOS transistor and a fifth NMOS transistor connected in parallel, the first PMOS transistor has a first clock signal is supplied to its gate, while the second NMOS transistor has a first inverted clock signal supplied to its gate, the first inverted clock signal obtained by inverting the first clock signal, and the fifth PMOS transistor has a second clock signal is supplied to its gate, while the fifth NMOS transistor has a second inverted clock signal supplied to its gate, the second inverted clock signal obtained by inverting the second clock signal. The chopper type voltage comparison circuit may be used for a voltage comparison circuit in a sequential-comparison analog digital converting circuit to which an input signal voltage or a local analog voltage generated by a local digital analog converting circuit is input in a switching manner.

In the chopper type voltage comparison circuit according to the aspect of the present invention, the CMOS clocked inverter circuit for input potential setting may include a first PMOS transistor, a second PMOS transistor, a first NMOS transistor, and a second NMOS transistor connected in series between a power supply node and a ground node, the second PMOS transistor and the first NMOS transistor having their gates connected together, the first PMOS transistor has a higher threshold voltage than the second PMOS transistor, while the second NMOS transistor has a higher threshold voltage than the first NMOS transistor, the first PMOS transistor and the second NMOS transistor are switch-controlled by clock signals, the clocked inverter circuit for voltage amplification may include a third PMOS transistor, a fourth PMOS transistor, a third NMOS transistor, and a fourth NMOS transistor connected in series between a power supply node and a ground node, the fourth PMOS transistor and the third NMOS transistor having their gates connected together, the third PMOS transistor has a higher threshold voltage than the fourth PMOS transistor, while the fourth NMOS transistor has a higher threshold voltage than the third NMOS transistor, and the third PMOS transistor has its gate connected to the ground node, while the fourth NMOS transistor has its gate connected to the power supply node. In the chopper type voltage comparison circuit, the analog switch may comprise a fifth PMOS transistor and a fifth NMOS transistor connected in parallel, the first PMOS transistor has a first clock signal is supplied to its gate, while the second NMOS transistor has a first inverted clock signal supplied to its gate, the first inverted clock signal obtained by inverting the first clock signal, and the fifth PMOS transistor has a second clock signal is supplied to its gate, while the fifth NMOS transistor has a second inverted clock signal supplied to its gate, the second inverted clock obtained by inverting the second clock signal. The chopper type voltage comparison circuit may be used for a voltage comparison circuit in a sequential-comparison analog digital converting circuit to which an input signal voltage or a local analog voltage generated by a local digital analog converting circuit is input in a switching manner.

The chopper type voltage comparison circuit according to the aspect of the present invention may be used for a voltage comparison circuit in a sequential-comparison analog digital converting circuit to which an input signal voltage or a local analog voltage generated by a local digital analog converting circuit is input in a switching manner.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram showing an example of a sequential-comparison AD converter using chopper type voltage comparison circuits according to a first embodiment of the present invention;

DETAILED DESCRIPTION OF THE INVENTION

Figures 2, 3:
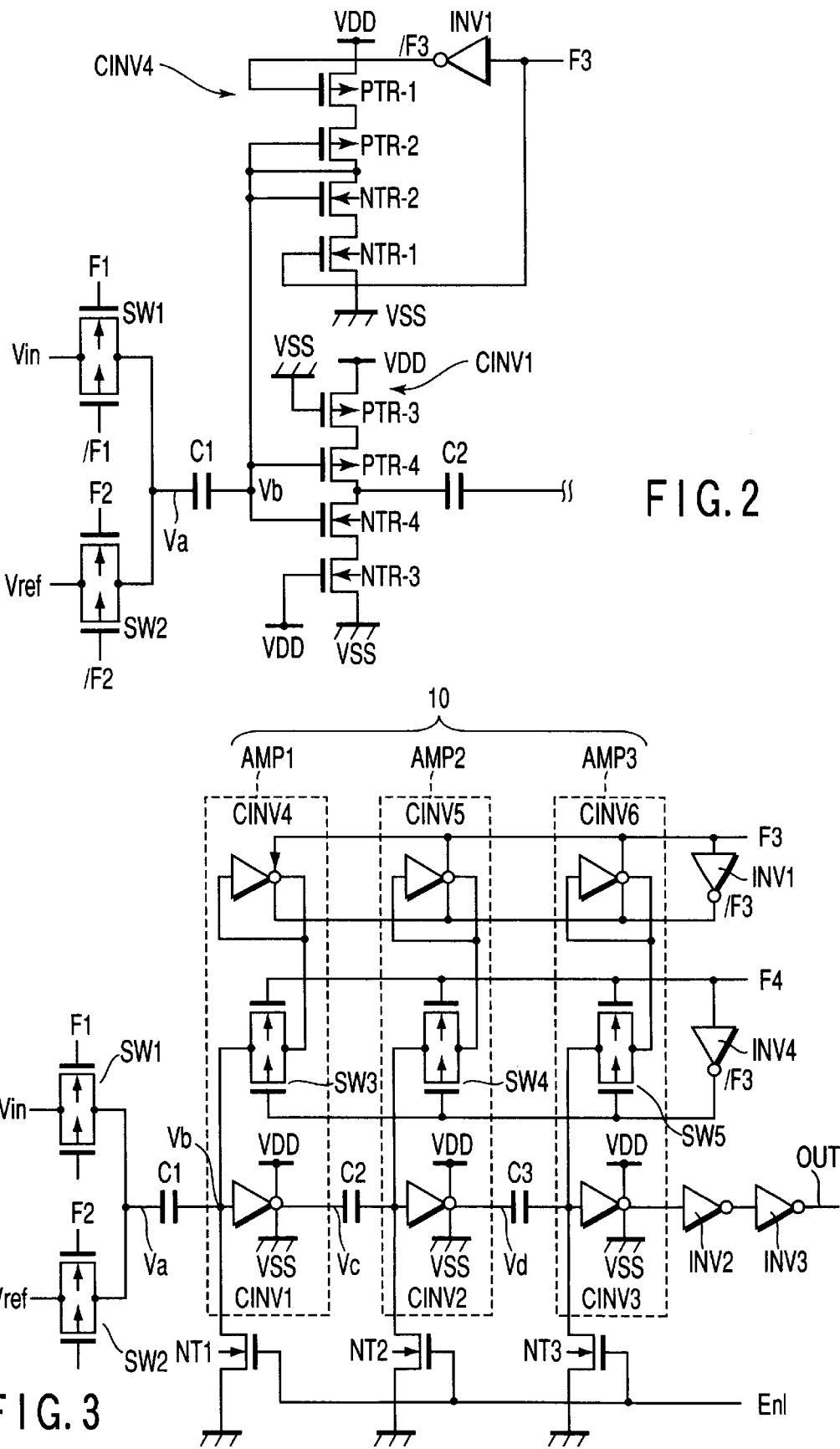
FIG. 2 is a circuit diagram showing an example of the present invention, showing a first one of the chopper type voltage comparison circuits in FIG. 1 which is selected as a representative, as well as analog switches SW1 and SW2 and a switch control signal.
FIG. 3 is a block diagram showing part of a sequential-comparison AD converter using chopper type voltage comparison circuits according to a second embodiment of the present invention.

Embodiments of the present invention will be explained below in detail with reference to the drawings.

<First Embodiment>

FIG. 1 shows an example of an 8-bit sequential-comparison AD converter using chopper type voltage comparison circuits according to a first embodiment of the present invention.

In FIG. 1, analog switches SW1 and SW2 selects, in a switching fashion, a conversion voltage input that is a signal input voltage Vin and a local analog voltage that is a reference voltage Vref. The analog switch SW1 is controlled by complementary clock signals (F1, /F1). The analog switch SW2 is controlled by complementary clock signals (F2, /F2).

A voltage comparison circuit 10 comprises, for example, three chopper type voltage comparison circuits having, for example, two inverter circuits INV2, INV3 connected on their output side.

A code generating logic circuit 11 generates a digital code based on an output voltage from the voltage comparison circuit 10. A local DA conversion circuit 12 DA converts an output from the code generating logic circuit 11 to generate a local analog voltage.

Each chopper type voltage comparison circuit comprises a capacitor having an input voltage or a reference voltage supplied to one end thereof depending on whether a voltage input operation (a sample period) or a voltage comparison operation (a comparison period) is to be performed, and an amplifying circuit including a CMOS clocked inverter for voltage amplification having an input node connected to the other end of the capacitor, and CMOS clocked inverter for input voltage (bias) setting provided to bias the input node potential of the CMOS clocked inverter to a circuit threshold value and having an input node connected to the other end of the capacitor.

Correspondingly to the first, second, and third comparison circuits, the capacitors are denoted by C1 to C3, the CMOS clocked inverter circuits for voltage amplification are denoted by INV1 to INV3, the CMOS clocked inverters for input potential (bias) setting are denoted by CINV4 to CINV6, and the amplifying circuits are denoted by AMP1 to AMP3. The first comparison circuit comprises the capacitor C1, and the amplifying circuit AMP1 having the CMOS clocked inverter circuit INV1 and the CMOS clocked inverter circuit INV4. The second comparison circuit comprises the capacitor C2, and the amplifying circuit AMP2 having the CMOS clocked inverter circuit INV2 and the CMOS clocked inverter circuit INV5. The third comparison circuit comprises the capacitor C3, and the amplifying circuit AMP3 having the CMOS clocked inverter circuit INV3 and the CMOS clocked inverter circuit INV6.

The clocked inverters CINV1 to CINV3 for voltage amplification are each biased so that transistors in a clock gate section thereof are normally conductive. In addition, the clocked inverters CINV4 to CINV6 for input potential setting have almost the same circuit configuration as the clocked inverters CINV1 to CINV3 for voltage amplification. The clocked inverters CINV4 to CINV6 for input potential setting, however, each have an input and output nodes short-circuited to each other. The clocked inverters CINV4 to CINV6 for input potential setting, also, each have transistors in a clock gate section of controlled by a clock signal F3 and an inverted clock signal /F3 obtained by the inverter circuit INV1 by inverting the clock signal F3. The transistors in the clock gate section are switch-controlled to be turned on for the voltage input operation, while the transistors in the clock gate section are switch-controlled to be turned off for the voltage comparison operation.

NMOS transistors NT1 to NT3 are each connected between a ground node and an input node of a corresponding one of the clocked inverters for voltage amplification CINV1 to CINV3, with an enable control signal En1 commonly applied to the gates of the NMOS transistors NT1 to NT3 in a predetermined timing. Thus, the NMOS transistors NT1 to NT3 are switch-controlled to be turned on in the predetermined timing to set the input node of each clocked inverters CINV1 to CINV3 to a ground potential.

FIG. 2 shows an example of the present invention, showing a first one of the chopper type voltage comparison circuits in FIG. 1 which is selected as a representative, as well as the analog switches SW1 and SW2 and a switch control input signal.

In this chopper type voltage comparison circuit, the clocked inverter CINV4 for input potential setting has a first PMOS transistor PTR-1, a second PMOS transistor PTR-2, a first NMOS transistor NTR-2, and a second NMOS transistor NTR-1 connected in series between a power supply node (a VDD node) with a power supply voltage VDD supplied thereto and a ground node (a VSS node) with a ground potential VSS supplied thereto.

The second PMOS transistor PTR-2 and the first NMOS transistor NTR-2 have their gates connected to an input node, which is connected an input node of the clocked inverter CINV1 for voltage amplification.

The second NMOS transistor NTR-1 is switch-controlled by the clock signal F3, while the first PMOS transistor PTR-1 is switch-controlled by the clock signal /F3.

The first PMOS transistor PTR-1 has a higher threshold voltage than the second PMOS transistor PTR-2, and the second NMOS transistor NTR-1 has a higher threshold voltage than the first NMOS transistor NTR-2. In addition, the second PMOS transistor PTR-2 and the first NMOS transistor NTR-2 each have a low threshold voltage so that the sum of the threshold voltages is smaller than the VDD.

On the other hand, the clocked inverter CINV1 for voltage amplification has a third PMOS transistor PTR-3, a fourth PMOS transistor PTR-4, a third NMOS transistor NTR-4, and a fourth NMOS transistor NTR-3 connected in series between a power supply node (a VDD node) with a power supply voltage VDD supplied thereto and a ground node (a VSS node) with a ground potential VSS supplied thereto.

The fourth PMOS transistor PTR-4 and the third NMOS transistor NTR-4 have gates connected to an input node, to which a voltage Vb at the other end of the capacitor C1 is input. Additionally, a gate of the third PMOS transistor PTR-3 in a clock gate section is connected to the VSS node, and a gate of the fourth NMOS transistor NTR-4 in the clock gate section is connected to the VDD node.

The third PMOS transistor PTR-3 has a higher threshold voltage than the fourth PMOS transistor PTR-4, and the fourth NMOS transistor NTR-3 has a higher threshold voltage than the third NMOS transistor NTR-4. In addition, the fourth PMOS transistor PTR-4 and the third NMOS transistor NTR-4 each have a low threshold voltage so that the sum of the threshold voltages is smaller than the VDD.

Next, an example of the operation of the chopper type voltage comparison circuit shown in FIGS. 1 and 2 will be described.

First, during a sample period, the analog switch SW1 and a clock gate of each of the clocked inverters CINV4 to CINV6 (the first PMOS transistor PTR-1 and second NMOS transistor NTR-1) are switch-controlled to be conductive, while the analog switch SW2 is switch-controlled to be non-conductive.

The clocked inverters CINV4 to CINV6 for input potential setting have the short-circuited input and output nodes to have the same potential at the short-circuited input and output nodes, so that in an operative state, each input node has its potential biased to a circuit threshold voltage (substantially VDD/2).

In this case, since the clocked inverters CINV1 to CINV3 for voltage amplification have the same circuit configuration as the clocked inverters CINV4 to CINV6 for input potential setting, the clocked inverters CINV1 to CINV3 for voltage amplification are activated to set the potential of an output of each clocked inverter CINV1 to CINV3 for voltage amplification to be equal (substantially VDD/2) to that of the corresponding input node for initialization.

In this manner, while the clocked inverters CINV1 to CINV3 for voltage amplification are being initialized, the voltage of a conversion voltage input Vin is charged to the input side capacitor C1 of the inverter CINV1, an output voltage Vc of the voltage amplifying circuit CINV1 is charged to the input side capacitor C2 of the clocked inverter CINV2 for voltage amplification, and an output voltage Vd of the clocked inverter CINV2 for voltage amplification is charged to the input side capacitor C3 of the clocked inverter CINV3 for voltage amplification.

Next, during a comparison period, the analog switch SW1 and the clock gate of each of the clocked inverters CINV4 to CINV6 (the first PMOS transistor PTR-1 and second NMOS transistor NTR-1) are switch-controlled to be non-conductive, while the analog switch SW2 is switch-controlled to be conductive.

Consequently, the reference voltage Vref is conducted to the capacitor C1 through the analog switch SW2 to change the potential at the input node of the clocked inverter circuit CINV1 depending on the difference in voltage between the Vin and the Vref, the change being amplified by the three clocked inverters CINV1 to CINV3. An output voltage from the final stage clocked inverter CINV3 is input further through the two inverters INV2 and INV3 to the code generating logic circuit 12, which then determines which of the Vin and Vref is higher to generate a digital code depending on a result of the determination.

The above described operations during the sample period and during the comparison period are repeated until the bits of an 8-bit digital code have sequentially been determined ranging from the most significant bit (MSB) to the least significant bit (LSB).

In the voltage comparison circuit configured as described above, the clocked inverters CINV1 to CINV3 for voltage amplification and the clocked inverters CINV4 to CINV6 for input potential setting have the same circuit configuration, and the clocked inverters CINV4 to CINV6 for input potential setting have the input and output nodes short-circuited to each other.

During the sample period (during the conversion voltage input operation), the conversion voltage input is charged to the capacitors C1 to C3, the clocked inverters CINV4 to CINV6 for input potential setting are controlled to be turned on, and the input and output nodes of each clocked inverter CINV1 to CINV3 for voltage amplification have their potentials biased to the circuit threshold (initialization).

On the contrary, during the comparison period (during the voltage comparison operation), the clocked inverters CINV4 to CINV6 for input potential setting are controlled to be turned off, and the reference voltage is input to the capacitors C1 to C3 to transmit the difference between the conversion voltage input and the reference voltage to the clocked inverters CINV1 to CINV3 for voltage amplification through the capacitors C1 to C3, respectively, for amplification.

Thus, even if the power supply voltage VDD decreases down to, for example, 1.8V or lower, the clocked inverters CINV1 to CINV3 for voltage amplification can be normally operated by setting low threshold voltages for the fourth PMOS transistor PTR-4 and third NMOS transistor NTR-4 in each of the clocked inverters CINV1 to CINV3 for voltage amplification.

Additionally, by setting low threshold voltages for the second PMOS transistor PTR-2 and first NMOS transistor NTR-2 in each clocked inverters CINV4 to CINV6 for input potential setting, the clocked inverters CINV4 to CINV6 for input potential setting can be normally operated during the sample period (during the conversion voltage input operation) and have their input and output nodes set at the same potential, thereby ensuring initialization of the clocked inverters CINV1 to CINV3 for voltage amplification.

None of the transistors cause leakage current between the input node and output node of each clocked inverter CINV1 to CINV3 for voltage amplification, and by setting high threshold voltages for the first PMOS transistor PTR-1 and second NMOS transistor NTR-1 in the clocked inverters for input potential setting, leakage current from the transistors is restrained during the comparison period (during the voltage comparison operation).

Consequently, the potentials at the input nodes of the clocked inverters CINV1 to CINV3 for voltage amplification do not change due to the leakage current during the comparison period (during the voltage comparison operation) while the AD converter is performing a sequential conversion operation, thereby preventing a decrease in AD conversion accuracy (degradation).

<Second Embodiment>

In the above described first embodiment, when the clocked inverters CINV4 to CINV6 for input potential setting have their clock gates controlled to be turned off by the clock signal F3 and its inverted clock signal /F3, time differences due to the delays may exist in these signals whereby the first PMOS transistor PTR-1 of each of the clocked inverters CINV4 to CINV6 for input potential setting may be turned off with a timing different from that with which the second NMOS transistor NTR-1 thereof is turned off. In this case, there will be a period when the potentials at the input and output nodes of each of the clocked inverters CINV4 to CINV6 for input potential setting deviate slightly from desired circuit threshold voltages, and this change in voltage may be transmitted to the input nodes of the clocked inverters CINV1 to CINV3 for voltage amplification. A second embodiment that avoids this problem will be described below.

FIG. 3 shows part of a sequential-comparison AD converter using chopper type voltage comparison circuits according to a second embodiment of the present invention.

The AD converter partly shown in FIG. 3 is the same as that described above with reference to FIG. 1 except that the chopper type voltage comparison circuits in the voltage comparison circuit 10 differ from those in the voltage comparison circuit 10 shown in FIG. 1, and is thus denoted by the same reference numerals as in FIG. 1.

The amplifying circuits AMP1 to AMP3 of the chopper type voltage comparison circuits have analog switches SW3 to SW5 interposed (i.e., added) between the input nodes of the clocked inverters CINV1 to CINV3 for voltage amplification and the input nodes of the clocked inverters CINV4 to CINV6 for input potential setting, respectively. That is, the amplifying circuit AMP1 has an analog switch SW3 interposed between the input node of the clocked inverter CINV1 for voltage amplification and the input node of the clocked inverters CINV4 for input potential setting. The amplifying circuit AMP2 has an analog switch SW4 interposed between the input node of the clocked inverter CINV2 for voltage amplification and the input node of the clocked inverters CINV5 for input potential setting. The amplifying circuit AMP3 has an analog switch SW5 interposed between the input node of the clocked inverter CINV3 for voltage amplification and the input node of the clocked inverters CINV6 for input potential setting. These analog switches SW3 to SW5 are controlled to be conductive for the conversion voltage input operation by means of a clock signal F4 and an inverted clock signal /F4 obtained by the inverter circuit INV4 by inverting the clock signal F4, and are controlled to be non-conductive for the voltage comparison operation before the clocked inverters CINV4 to CINV6 for input potential setting are switch-controlled to be turned off.

Figure 4:
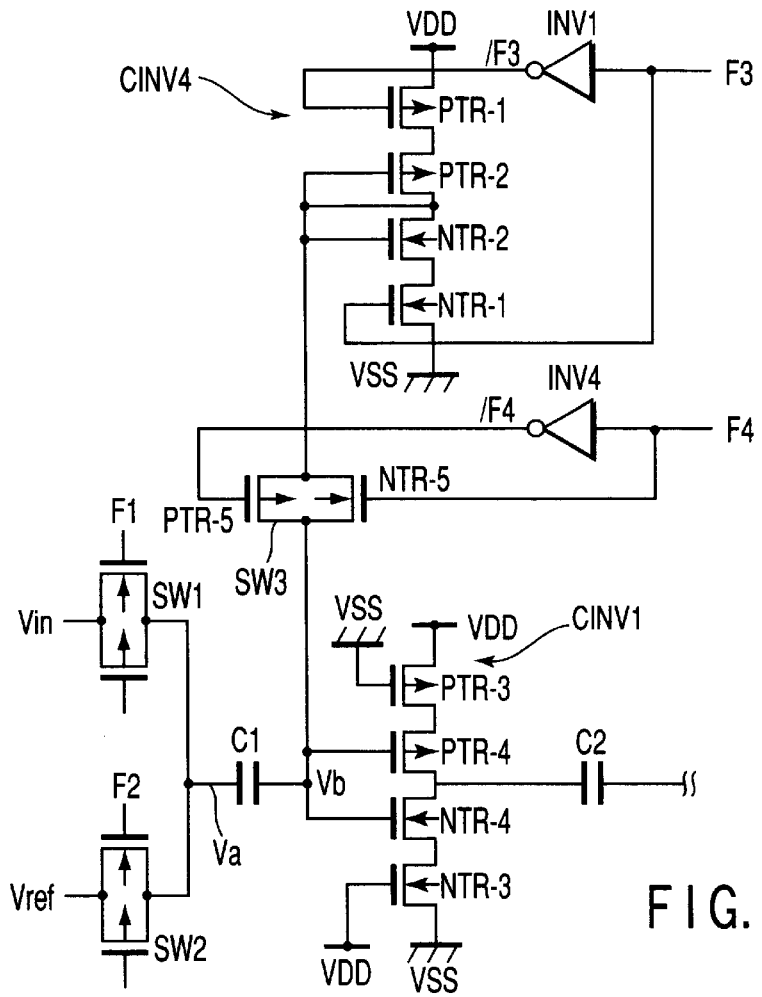
FIG. 4 is a circuit diagram showing an example of the present invention, showing a first one of the chopper type voltage comparison circuits in FIG. 3 which is selected as a representative, as well as analog switches SW1 and SW2 and a switch control signal.
Figure 5:
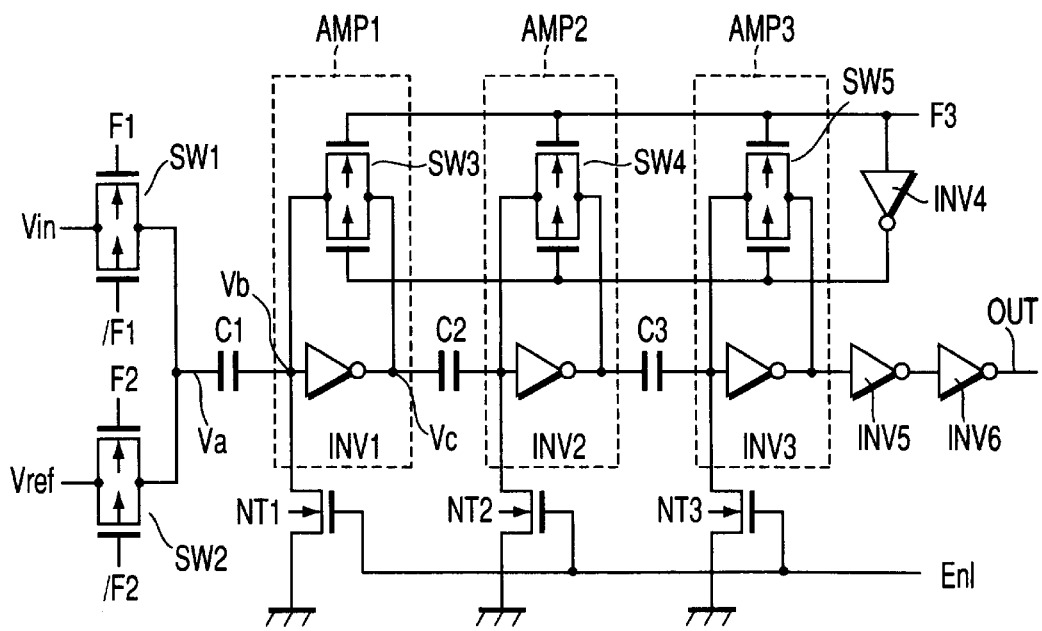
FIG. 5 is a block diagram showing an example of conventional chopper type voltage comparison circuits used in a sequential-comparison AD converter.

FIG. 4 shows a specific example of the present invention, showing a first one of the chopper type voltage comparison circuits in FIG. 3 which is selected as a representative, as well as the analog switches SW1 and SW2, a switch control signal, and the following capacitor C2.

The chopper type voltage comparison circuit shown in FIG. 4 is the same as that described above with reference to FIG. 2 except for the CMOS analog switch SW3 interposed between the input node of the clocked inverter CINV1 for voltage amplification and the input node of the clocked inverter CINV4 for input potential setting and controlled to be conductive or non-conductive by means of the clock signal F4 and its inverted clock signal /F4. Thus, this chopper type voltage comparison circuit is denoted by the same reference numerals as in FIG. 2.

The transistors PTR-5, NTR-5 constituting the analog switch SW3 have low thresholds so as to operate even under a low power supply voltage VDD, similarly to the transistors PTR-4, NTR-4 having their gates connected to the input node of the clocked inverter CINV1 for voltage amplification and the transistors PTR-2, NTR-2 having their gates connected to the input node of the clocked inverter CINV4 for input potential setting.

The operation of the chopper type voltage comparison circuit in the AD converter shown in FIGS. 3 and 4 is the same as that of the chopper type voltage comparison circuit in the AD converter described above with reference to FIGS. 1 and 2 except that when the conversion voltage input operation shifts to the voltage comparison operation, the analog switches SW3 to SW5 are first controlled to be non-conductive, and then the analog switch SW2 is controlled to be conductive while the clocked inverters CINV4 to CINV6 for input potential setting are turned off.

As described above, when the clocked inverters CINV4 to CINV6 for input potential setting have their clock gates controlled to be turned off by the clock signal F3 and its inverted clock signal /F3, even if time differences due to the delays may exist in these signals whereby the first PMOS transistor PTR-1 of each of the clocked inverters CINV4 to CINV6 for input potential setting may be turned off with a timing different from that with which the second NMOS transistor NTR-1 thereof is turned off, thereby changing the potential at the input nodes, the change in potential at the input node of each of the clock inverters CINV4 to CINV6 for input potential setting is not transmitted to the input node of the corresponding clock inverter CINV1 to CINV3 for voltage amplification, since the analog switches have been controlled to be non-conductive.

Therefore, when the conversion voltage input operation shifts to the voltage comparison operation during the sequential conversion operation of the AD converter, the potential at the input node of each of the clocked inverters CINV1 to CINV3 for voltage amplification does not vary, thereby further improving AD conversion accuracy.

As described above, according to the chopper type voltage comparison circuit of the present invention, even if the threshold voltages for the transistors are reduced to lower the power supply voltage, leakage current between the input node and output node of each of the amplifying circuits is restrained to enable normal voltage comparison operations, thereby preventing a decrease in AD conversion accuracy if the circuit is used for an AD converter.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A chopper type voltage comparison circuit comprising:
   a capacitor having an input voltage or a reference voltage supplied to one end thereof in a switching fashion depending on whether a voltage input operation or a voltage comparison operation is to be performed;
   a CMOS inverter circuit for voltage amplification having a voltage at the other end of the capacitor input to an input node thereof and having a clock gate section biased so as to be constantly conductive; and
   a CMOS clocked inverter circuit for input voltage setting, having input and output nodes short-circuited together, and connected to the input node of the CMOS clocked inverter circuit for voltage amplification so that the clock gate section is switch-controlled to be turned on for the voltage input operation, while the clock gate section is switch-controlled to be turned off for the voltage comparison operation.

2. A chopper type voltage comparison circuit according to claim 1, further comprising an analog switch interposed between the input node of the CMOS clocked inverter circuit for voltage amplification and the input node of the CMOS clocked inverter for input voltage setting and controlled to be conductive for the voltage input operation and to be non-conductive for the voltage comparison operation before the clock gate of the CMOS clocked inverter for input voltage setting is switch-controlled to be turned off.

3. A chopper type voltage comparison circuit according to claim 1, wherein:
   said CMOS clocked inverter circuit for input potential setting includes a first PMOS transistor, a second PMOS transistor, a first NMOS transistor, and a second NMOS transistor connected in series between a power supply node and a ground node, said second PMOS transistor and said first NMOS transistor having their gates connected together,
   said first PMOS transistor has a higher threshold voltage than said second PMOS transistor, while said second NMOS transistor has a higher threshold voltage than said first NMOS transistor,
   said first PMOS transistor and said second NMOS transistor are switch-controlled by clock signals,
   said clocked inverter circuit for voltage amplification includes a third PMOS transistor, a fourth PMOS transistor, a third NMOS transistor, and a fourth NMOS transistor connected in series between a power supply node and a ground node, said fourth PMOS transistor and said third NMOS transistor having their gates connected together,
   said third PMOS transistor has a higher threshold voltage than said fourth PMOS transistor, while said fourth NMOS transistor has a higher threshold voltage than said third NMOS transistor, and
   said third PMOS transistor has its gate connected to the ground node, while said fourth NMOS transistor has its gate connected to the power supply node.

4. A chopper type voltage comparison circuit according to claim 2, wherein:
   said CMOS clocked inverter circuit for input potential setting includes a first PMOS transistor, a second PMOS transistor, a first NMOS transistor, and a second NMOS transistor connected in series between a power supply node and a ground node, said second PMOS transistor and said first NMOS transistor having their gates connected together,
   said first PMOS transistor has a higher threshold voltage than said second PMOS transistor, while said second NMOS transistor has a higher threshold voltage than said first NMOS transistor,
   said first PMOS transistor and said second NMOS transistor are switch-controlled by clock signals,
   said clocked inverter circuit for voltage amplification includes a third PMOS transistor, a fourth PMOS transistor, a third NMOS transistor, and a fourth NMOS transistor connected in series between a power supply node and a ground node, said fourth PMOS transistor and said third NMOS transistor having their gates connected together,
   said third PMOS transistor has a higher threshold voltage than said fourth PMOS transistor, while said fourth NMOS transistor has a higher threshold voltage than said third NMOS transistor, and
   said third PMOS transistor has its gate connected to the ground node, while said fourth NMOS transistor has its gate connected to the power supply node.

5. A chopper type voltage comparison circuit according to claim 2, wherein said analog switch comprises a fifth PMOS transistor and a fifth NMOS transistor connected in parallel,
   said first PMOS transistor has a first clock signal is supplied to its gate, while said second NMOS transistor has a first inverted clock signal supplied to its gate, the first inverted clock signal obtained by inverting said first clock signal, and
   said fifth PMOS transistor has a second clock signal is supplied to its gate, while said fifth NMOS transistor has a second inverted clock signal supplied to its gate, the second inverted clock signal obtained by inverting said second clock signal.

6. A chopper type voltage comparison circuit according to claim 3, wherein said analog switch comprises a fifth PMOS transistor and a fifth NMOS transistor connected in parallel,
   said first PMOS transistor has a first clock signal is supplied to its gate, while said second NMOS transistor has a first inverted clock signal supplied to its gate, the first inverted clock signal obtained by inverting said first clock signal, and
   said fifth PMOS transistor has a second clock signal is supplied to its gate, while said fifth NMOS transistor has a second inverted clock signal supplied to its gate, the second inverted clock signal obtained by inverting said second clock signal.

7. A chopper type voltage comparison circuit according to claim 4, wherein said analog switch comprises a fifth PMOS transistor and a fifth NMOS transistor connected in parallel,
   said first PMOS transistor has a first clock signal is supplied to its gate, while said second NMOS transistor has a first inverted clock signal supplied to its gate, the first inverted clock signal obtained by inverting said first clock signal, and said fifth PMOS transistor has a second clock signal is supplied to its gate, while said fifth NMOS transistor has a second inverted clock signal supplied to its gate, the second inverted clock signal obtained by inverting said second clock signal.

8. A chopper type voltage comparison circuit according to claim 1, which is used for a voltage comparison circuit in a sequential-comparison analog digital converting circuit to which an input signal voltage or a local analog voltage generated by a local digital analog converting circuit is input in a switching manner.

9. A chopper type voltage comparison circuit according to claim 2, which is used for a voltage comparison circuit in a sequential-comparison analog digital converting circuit to which an input signal voltage or a local analog voltage generated by a local digital analog converting circuit is input in a switching manner.

10. A chopper type voltage comparison circuit according to claim 3, which is used for a voltage comparison circuit in a sequential-comparison analog digital converting circuit to which an input signal voltage or a local analog voltage generated by a local digital analog converting circuit is input in a switching manner.

11. A chopper type voltage comparison circuit according to claim 4, which is used for a voltage comparison circuit in a sequential-comparison analog digital converting circuit to which an input signal voltage or a local analog voltage generated by a local digital analog converting circuit is input in a switching manner.

12. A chopper type voltage comparison circuit according to claim 5, which is used for a voltage comparison circuit in a sequential-comparison analog digital converting circuit to which an input signal voltage or a local analog voltage generated by a local digital analog converting circuit is input in a switching manner.

13. A chopper type voltage comparison circuit according to claim 6, which is used for a voltage comparison circuit in a sequential-comparison analog digital converting circuit to which an input signal voltage or a local analog voltage generated by a local digital analog converting circuit is input in a switching manner.

14. A chopper type voltage comparison circuit according to claim 7, which is used for a voltage comparison circuit in a sequential-comparison analog digital converting circuit to which an input signal voltage or a local analog voltage generated by a local digital analog converting circuit is input in a switching manner.

* * * * *